United States Patent
Kariya

(10) Patent No.: US 12,056,394 B2
(45) Date of Patent: Aug. 6, 2024

(54) MEMORY INTERFACE TRAINING

(71) Applicant: Cadence Design Systems, Inc., San Jose, CA (US)

(72) Inventor: Kartik Dayalal Kariya, Bangalore (IN)

(73) Assignee: Cadence Design Systems, Inc., San Jose, CA (US)

( * ) Notice: Subject to any disclaimer, the term of this patent is extended or adjusted under 35 U.S.C. 154(b) by 17 days.

(21) Appl. No.: 17/393,827

(22) Filed: Aug. 4, 2021

(65) Prior Publication Data

US 2022/0050634 A1 Feb. 17, 2022

Related U.S. Application Data

(60) Provisional application No. 63/065,115, filed on Aug. 13, 2020.

(51) Int. Cl.
G06F 3/06 (2006.01)

(52) U.S. Cl.
CPC .......... G06F 3/0659 (2013.01); G06F 3/0604 (2013.01); G06F 3/0673 (2013.01)

(58) Field of Classification Search
CPC .... G06F 3/0659; G06F 3/0604; G06F 3/0673; G06F 13/1689; Y02D 10/00; G11C 29/023; G11C 7/222; G11C 2207/2254; G11C 29/028
See application file for complete search history.

(56) References Cited

U.S. PATENT DOCUMENTS

| | | | |
|---|---|---|---|
| 6,128,696 A | 10/2000 | Farmwald et al. | |
| RE39,879 E | 10/2007 | Barth et al. | |
| 7,752,476 B2 | 7/2010 | Macri et al. | |
| 7,986,584 B2 | 7/2011 | Tsern et al. | |
| 8,139,430 B2 | 3/2012 | Buchmann et al. | |
| 8,589,717 B1 * | 11/2013 | Davis | G06F 1/04 713/600 |
| 8,913,459 B2 | 12/2014 | Kondo | |
| 9,536,590 B1 * | 1/2017 | Zhu | G11C 29/023 |
| 11,238,003 B2 * | 2/2022 | Wang | G06F 1/3206 |
| 2012/0072650 A1 | 3/2012 | Suzumura et al. | |
| 2012/0089854 A1 * | 4/2012 | Breakstone | G06F 13/4282 713/323 |

(Continued)

*Primary Examiner* — Charles Rones
*Assistant Examiner* — Alexander Vinnitsky
(74) *Attorney, Agent, or Firm* — Mark H. Whittenberger; Holland & Knight LLP

(57) ABSTRACT

A command/address (CA) interface of a memory controller coupled to a memory component is trained (e.g., voltages and timings are adjusted to maximize signal eye opening, sample timing margins etc.) while the CA interface is operated at highest known supported controller PHY frequency. After the CA interface has been trained at highest known supported controller PHY frequency, vendor specific information (e.g., vendor ID number, clock configuration, VDDQ configuration, etc.) is read from the memory component. If the vendor specific information indicates that the CA interface may be operated at a different (e.g., higher) frequency, the memory controller reconfigures its physical interface to operate at the indicated frequency. The memory controller then re-trains its CA interface while operating the CA interface at the indicated frequency.

9 Claims, 8 Drawing Sheets

(56) References Cited

U.S. PATENT DOCUMENTS

| | | | |
|---|---|---|---|
| 2016/0147452 A1* | 5/2016 | Bae .................... | G11C 29/023 |
| | | | 711/103 |
| 2018/0299921 A1* | 10/2018 | Rajwani ................ | G06F 13/161 |
| 2021/0201986 A1* | 7/2021 | Brandl ................. | G11C 29/028 |
| 2021/0224684 A1* | 7/2021 | Sarkar .................. | G06F 16/907 |
| 2021/0240371 A1* | 8/2021 | Rajagopalan ......... | G06F 3/0653 |

* cited by examiner

```
┌─────────────────────────────────────────────────────────────┐
│ PROVIDE, AT A FIRST FREQUENCY, A COMMAND INTERFACE CLOCK    │
│ TO BE USED BY A COMMAND INTERFACE OF A MEMORY DEVICE TO     │
│ DETERMINE A FIRST OPERATING FREQUENCY OF THE COMMAND        │
│ INTERFACE                                                   │
│ 202                                                         │
└─────────────────────────────────────────────────────────────┘
                              │
┌─────────────────────────────────────────────────────────────┐
│ TRAIN A CONTROLLER INTERFACE COUPLED TO THE COMMAND         │
│ INTERFACE WHILE THE COMMAND INTERFACE IS OPERATED AT THE    │
│ FIRST FREQUENCY                                             │
│ 204                                                         │
└─────────────────────────────────────────────────────────────┘
                              │
┌─────────────────────────────────────────────────────────────┐
│ AFTER TRAINING THE CONTROLLER INTERFACE WHILE THE COMMAND   │
│ INTERFACE IS OPERATED AT THE FIRST FREQUENCY, READING A     │
│ VENDOR SPECIFIC INDICATOR WHILE THE COMMAND INTERFACE IS    │
│ OPERATED AT THE FIRST FREQUENCY                             │
│ 206                                                         │
└─────────────────────────────────────────────────────────────┘
                              │
┌─────────────────────────────────────────────────────────────┐
│ BASED ON THE VENDOR SPECIFIC INDICATOR, SELECTING A SECOND  │
│ OPERATING FREQUENCY FOR THE COMMAND INTERFACE.              │
│ 208                                                         │
└─────────────────────────────────────────────────────────────┘
```

*FIG. 2*

TRAIN A COMMAND INTERFACE WHILE THE COMMAND INTERFACE IS OPERATED AT A FIRST FREQUENCY
302

AFTER TRAINING THE COMMAND INTERFACE WHILE THE COMMAND INTERFACE IS OPERATED AT THE FIRST FREQUENCY, READ A VENDOR SPECIFIC INDICATOR WHILE THE COMMAND INTERFACE IS OPERATED AT THE FIRST FREQUENCY
304

BASED ON THE VENDOR SPECIFIC INDICATOR, SELECTING A SECOND OPERATING FREQUENCY FOR THE COMMAND INTERFACE
306

TRAIN THE COMMAND INTERFACE WHILE THE COMMAND INTERFACE IS OPERATED AT THE SECOND FREQUENCY
308

*FIG. 3*

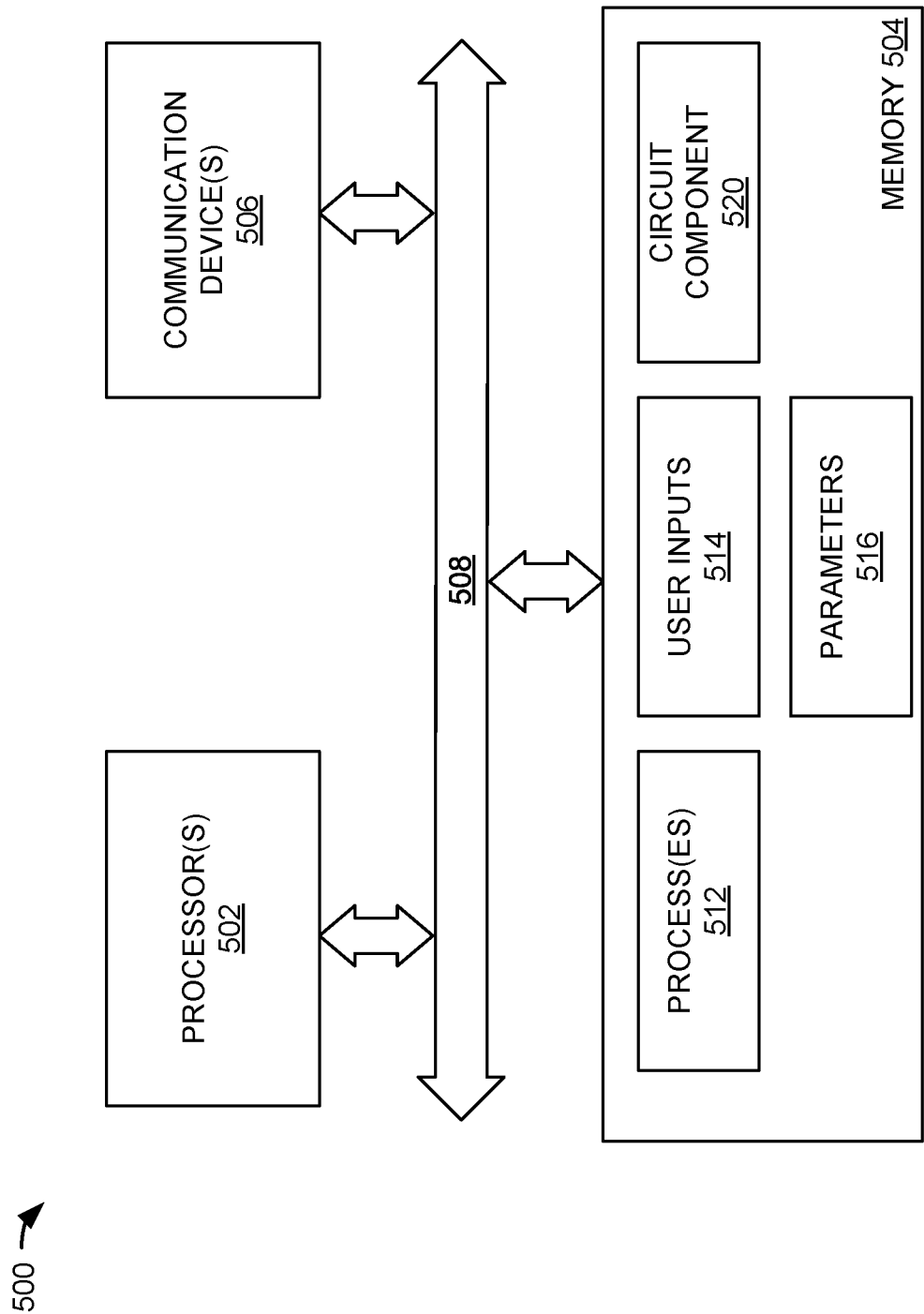

MEMORY INTERFACE TRAINING

BRIEF DESCRIPTION OF THE DRAWINGS

FIG. 2 is a flowchart of a method of operating a memory system.

FIG. 3 is a flowchart illustrating a method of re-training a memory system.

FIG. 5 is a block diagram of a processing system.

DETAILED DESCRIPTION OF THE EMBODIMENTS

Figure 1A:
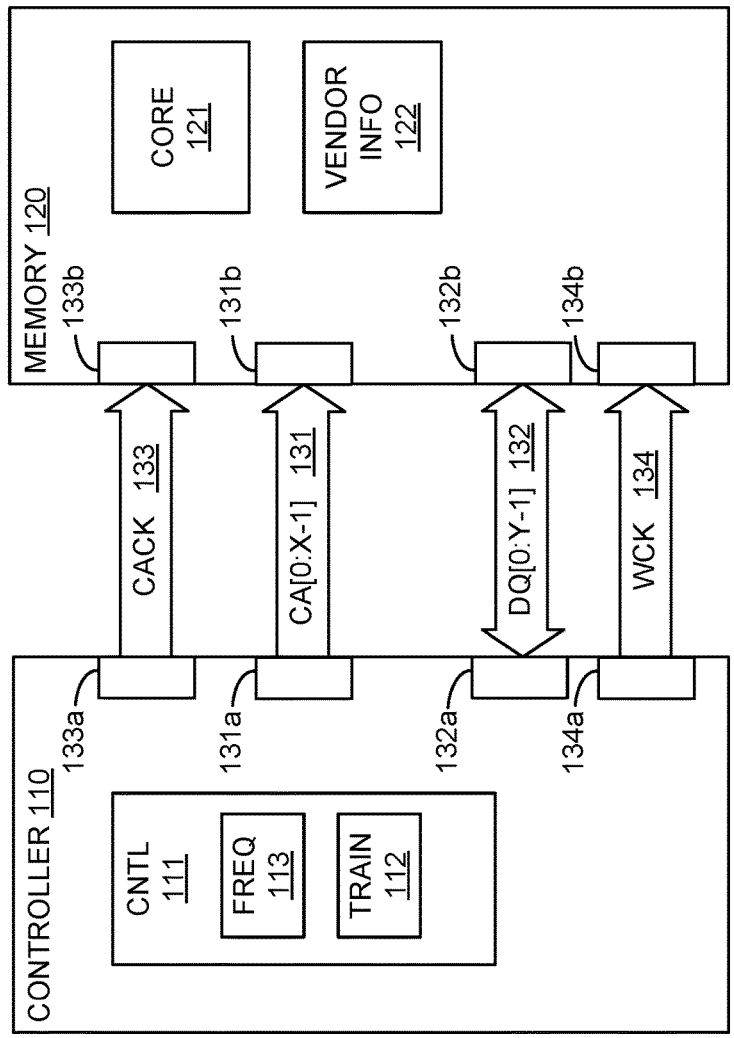
FIGS. 1A-1D are diagrams illustrating a memory system.

A memory controller (a.k.a., a controller) or memory controller design may be used with different memory component designs (e.g., devices from different vendors) that may have different configurations, features, operating frequencies, etc. In an embodiment, during initialization of a memory system, a memory controller configures its physical interface (PHY) to operate a highest known supported frequency. This highest known supported frequency is one which is known to be supported by the memory components and controller without knowing vendor identification details. The command/address (CA) interface of the memory controller is trained (e.g., voltages and timings are adjusted to maximize signal eye opening, sample timing margins etc.) while the CA interface is operated at this highest known supported frequency.

In an embodiment, after the CA interface has been trained at the highest known supported frequency, vendor specific information (e.g., vendor ID number, clock configuration, VDDQ configuration, etc.) is read from the memory component. If the vendor specific information indicates that the CA interface may be operated at a different (e.g., higher) frequency, the memory controller reconfigures its physical interface to operate at the indicated frequency. The memory controller then re-trains its CA interface while operating the CA interface at the indicated frequency. Thus, when the re-training is complete, the CA interface is ready (and trained) to operate at the frequency indicated by the vendor specific information.

FIGS. 1A-1D are diagrams illustrating a memory system. In FIGS. 1A-1D, memory system 100 comprises controller 110 and memory component 120. Controller 110 includes control circuitry 111, command/address (CA) interface 131a, data (DQ) interface 132a, CA clock (CACK) interface 133a, and data clock interface 134a. Control circuitry 111 includes frequency control circuitry 113 and training control circuitry 112. Memory component 120 includes memory core 121 (a.k.a., storage cell array), vendor specific information 122, CA interface 131b, DQ interface 132b, CA clock (CACK) interface 133b, and data clock interface 134b.

Controller 110 and memory component 120 may be integrated circuit type devices, such as are commonly referred to as a "chips". A memory controller, such as controller 120, manages the flow of data going to and from memory devices and/or memory modules. Memory component 120 (also referred to as memory component 120) may be a standalone device, or may be a component of a memory module. Memory component 120 may be a device that adheres to, or is compatible with, a Graphics Double Data Rate 6 (GDDR6) Synchronous Graphics Random Access Memory (SGRAM) specification. A memory controller can be a separate, standalone chip, or integrated into another chip. For example, a memory controller may be included on a single die with a microprocessor, or included as part of a more complex integrated circuit system such as a block of a system on a chip (SOC).

Controller 110 is operatively coupled to memory component 120 via CA interface 131a that is coupled to CA signal lines 131. CA signal lines 131 (and corresponding CA interface 131a on controller 110 and CA interface 131b on memory component 120) may be composed of X number of signal lines. In an embodiment, X=9. In an embodiment, CA signal lines 131 may include one or more (e.g., 1) data bus inversion (DBI) signal lines. Controller 110 is operatively coupled to memory component 120 to send commands and associated information (e.g., addresses) to memory component 120 via CA signal lines 131. Memory component 120 receives these commands (and associated information—e.g., addresses) via CA interface 131b that is also coupled to CA signal lines 131.

Controller 110 is also operatively coupled to memory component 120 via command/address clock (CACK) interface 133a that is coupled to CACK signal lines 133. CACK signal lines 133 (and corresponding CACK interface 133a on controller 110 and CACK interface 133b on memory component 120) may be composed of a plurality of number of differential signal lines. In an embodiment, there are two (2) CACK clock signal lines that carry a differential clock signal. Controller 110 is operatively coupled to memory component 120 to send a timing reference signal to memory component 120 via CACK signal lines 133. Memory component 120 receives the timing reference signal via CACK interface 133b that is also coupled to CACK signal lines 133. Memory component 120 uses the timing reference signal to determine the sample timing and frequency of operation of CA interface 131b. In an embodiment not illustrated in FIG. 1, controller 110 and memory component 120 may be coupled via multiple CA interfaces (e.g., 2 or Y=36) that share CACK signal lines 133.

Controller 110 is operatively coupled to memory component 120 via DQ interface 132a that is coupled to DQ signal lines 132. DQ signal lines 132 (and corresponding DQ interface 132a on controller 110 and DQ interface 132b on memory component 120) may be composed of Y number of signal lines. In an embodiment, Y=18. In an embodiment, DQ signal lines 132 may include one or more (e.g., 2) DBI signal lines. Controller 110 and memory component 120 are operatively coupled via DQ signal lines 132 to bidirectionally communicate data. Memory component 120 may store (e.g., in memory core 121) and retrieve (e.g., from memory core 121) data communicated via DQ interface 132b and DQ signal lines 132.

Controller 110 is also operatively coupled to memory component 120 via data clock (WCK) interface 134a that is coupled to WCK signal lines 134. WCK signal lines 134 (and corresponding WCK interface 134a on controller 110 and WCK interface 134b on memory component 120) may be composed of a plurality of number of differential signal lines. In an embodiment, there are two (2) WCK clock signal lines that carry a differential clock signal. Controller 110 is operatively coupled to memory component 120 to send a timing reference signal to memory component 120 via WCK signal lines 134. Memory component 120 receives the timing reference signal via WCK interface 134b that is also coupled to WCK signal lines 134. Memory component 120 uses the timing reference signal to determine the sample timing, transmit timing, and frequency of operation of DQ interface 132b (and by extension DQ interface 132a).

Figure 1B:
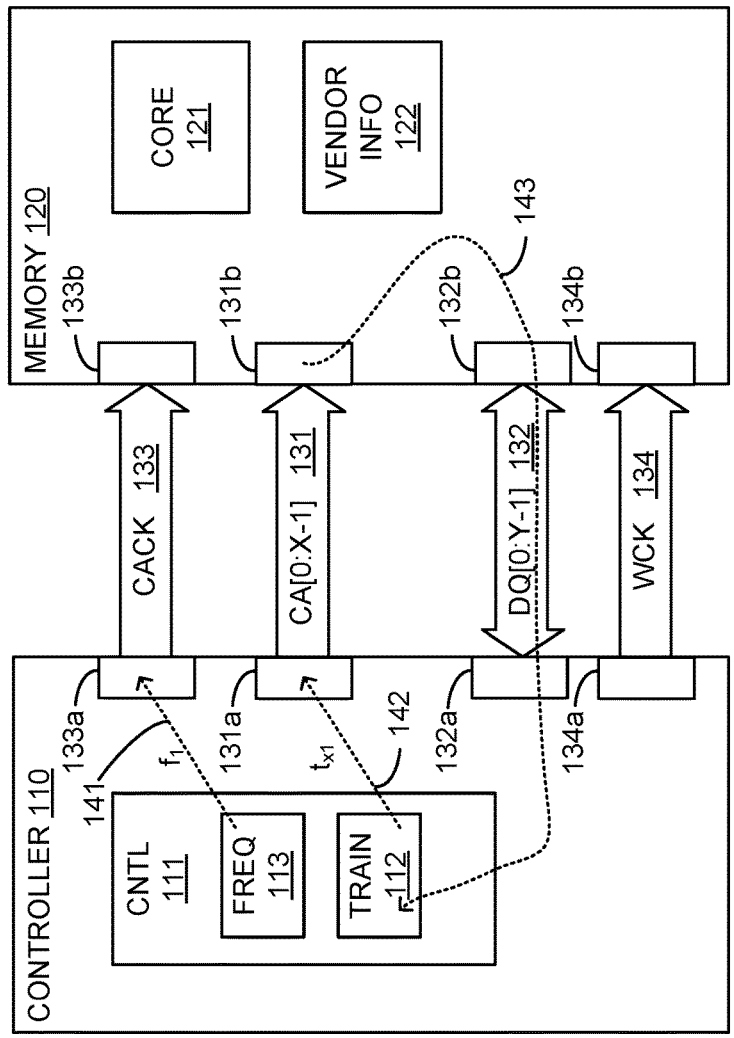
Figure 1C:
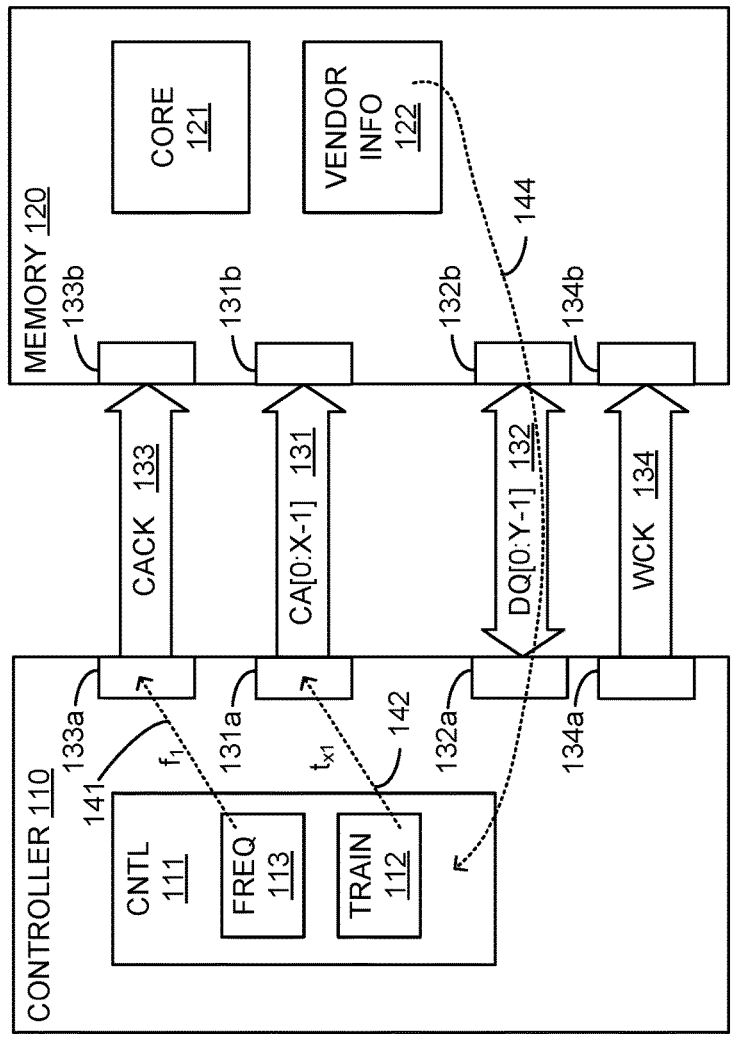

In an embodiment, after being reset, memory component 120 is initialized by controller 110. As part of the initialization process, controller 110 provides, from CACK interface 133*a* and at a first frequency ($f_1$), a command/address clock signal to be used by memory component 120 to determine a first operating frequency of CA interface 131*b*. This is illustrated in FIG. 1B by arrow 141 running from frequency control circuitry 113 to CACK interface 133*a*.

Also, as part of the initialization process, controller 110 trains CA interface 131*a* while CA interface 131*a* and CA interface 131*b* are operated at the first frequency. To receive the results and intermediate results of training adjustments to CA interface 131*a* and/or CACK interface 133*a*, controller 110 may place memory component 120 into a training mode.

Controller 110 may place memory component 120 into a training mode by, for example, issuing a mode register set (MRS) command to memory component 120 via CA interface 131*a*, CA signal lines 131, and CA interface 131*b*. The training mode that memory component 120 is place into may cause bridging of the values received at CA interface 131*b* to DQ interface 132*b*. One or more values received at CA interface 131*b* may be transmitted to controller 110 via DQ interface 132*b*, DQ signal lines 132, and DQ interface 132*b*. Controller 110 may then compare the patterns received by memory component 120 to expected values and adjust CA interface 131*a* transmit timings ($t_{x1}$) accordingly. This procedure may be repeated using different patterns and CA interface 131*a* interface timings. This is illustrated in FIG. 1B by arrow 142 running from training control circuitry 112 to CA interface 131*a* and arrow 143 running from CA interface 131*b* of memory component 120 to training control circuitry 112 via DQ interface 132*b*, DQ signal lines 132, and DQ interface 132*a*.

Controller 110 may place memory component 120 into a training mode by, for example, issuing a mode register set (MRS) command to memory component 120 via CA interface 131*a*, CA signal lines 131, and CA interface 131*b*. The training mode that memory component 120 is place into may cause bridging of the values received at CA interface 131*b* to DQ interface 132*b*. One or more values received at CA interface 131*b* may be transmitted to controller 110 via DQ interface 132*b*, DQ signal lines 132, and DQ interface 132*a*. Controller 110 may then compare the patterns received by memory component 120 to expected values and adjust CA interface 131*a* transmit timings ($t_{x1}$) accordingly. This procedure may be repeated using different patterns and CA interface 131*a* interface timings. This is illustrated in FIG. 1B by arrow 142 running from training control circuitry 112 to CA interface 131*a* and arrow 143 running from CA interface 131*b* of memory component 120 to training control circuitry 112 via DQ interface 132*b*, DQ signal lines 132, and DQ interface 132*a*.

In an embodiment, based on the vendor specific indicator, control circuitry 111 may select a second operating frequency for CA interface 131*a*, CA signal lines 131, and CA interface 131*b*. For example, if the vendor specific information 122 indicates that memory component 120 (and CA interface 131*b*, in particular) may be operated at a second and different (e.g., higher) frequency than it is currently being operated, control circuitry 111 may (via frequency control circuitry 113) configure CACK interface 133*a* to operate at this second frequency (e.g., $f_2$).

Figure 1D:
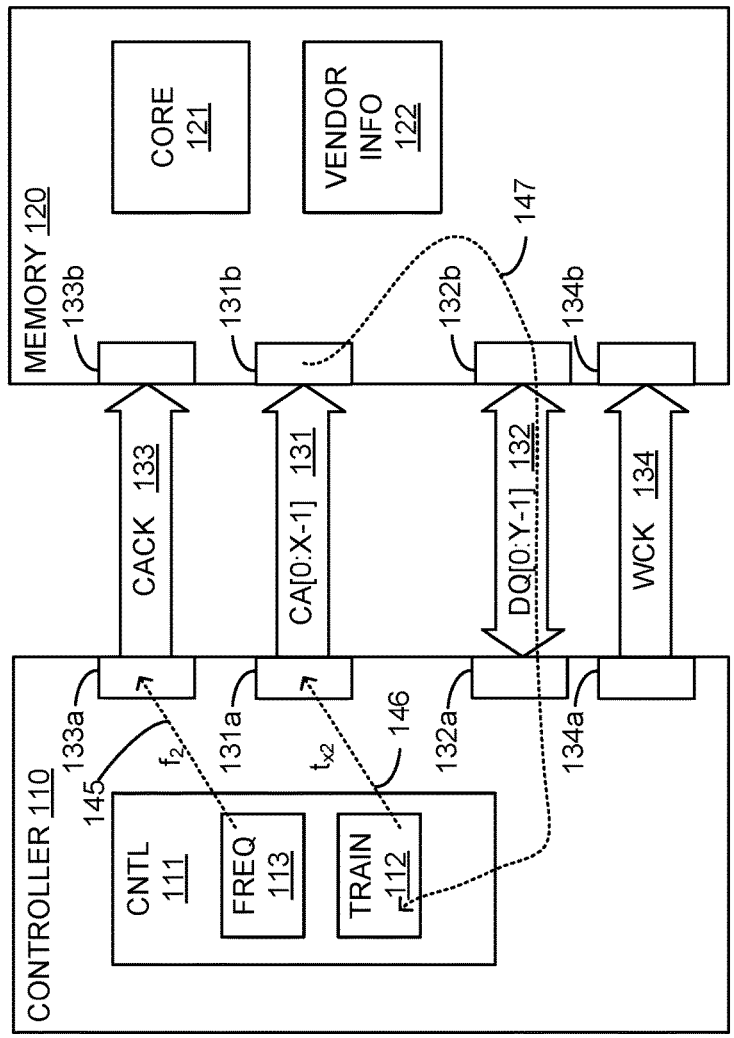

In an embodiment, while CACK interface 133*a* (and thus CA interface 131*a*, CA signal lines 131, and CA interface 131*b*) is operating at this second frequency (e.g., $f_2$), controller 110 may retrain CA interface 131*a*. Thus, based on the vendor specific indicator received from memory component 120, CA interface 131*a* may be retrained while operating at the second frequency resulting in retrained transmit timings ($t_{x2}$). This is illustrated in FIG. 1D by arrow 145 running from frequency control circuitry 113 to CACK interface 133*a*, arrow 146 running from training control circuitry 112 to CA interface 131*a*, and arrow 147 running from CA interface 131*b* of memory component 120 to training control circuitry 112 via DQ interface 132*b*, DQ signal lines 132, and DQ interface 132*a*.

FIG. 2 is a flowchart of a method of operating a memory system. One or more steps illustrated in FIG. 2 may be performed by, for example, memory system 100, and/or its components. At a first frequency, a command interface clock is provided to be used by a command interface of a memory device to determine a first operating frequency of the command interface (202). For example, controller 110 may provide, via CACK interface 133*a*, CACK signal lines 133 and CACK interface 133*b* and to memory component 120, a CACK clock signal that is cycling at a first frequency (e.g., $f_1$).

A controller interface coupled to the command interface is trained while the command interface is operated at the first frequency (204). For example, Controller 110 may place memory component 120 into a training mode by issuing an MRS command to memory component 120 via CA interface 131*a*, CA signal lines 131, and CA interface 131*b*. The training mode causes the bridging of the values received at CA interface 131*b* to DQ interface 132*b* where these values are transmitted to controller 110 via DQ interface 132*b*, DQ signal lines 132, and DQ interface 132*b*. Controller 110 then compares the patterns received by memory component 120 to expected values and adjusts CA interface 131*a* transmit timings ($t_{x1}$) accordingly. This procedure may be repeated using different patterns and CA interface 131*a* interface timings.

A controller interface coupled to the command interface is trained while the command interface is operated at the first frequency (204). For example, Controller 110 may place memory component 120 into a training mode by issuing an MRS command to memory component 120 via CA interface 131*a*, CA signal lines 131, and CA interface 131*b*. The training mode causes the bridging of the values received at CA interface 131*b* to DQ interface 132*b* where these values are transmitted to controller 110 via DQ interface 132*b*, DQ signal lines 132, and DQ interface 132*a*. Controller 110 then compares the patterns received by memory component 120 to expected values and adjusts CA interface 131*a* transmit timings ($t_{x1}$) accordingly. This procedure may be repeated using different patterns and CA interface 131*a* interface timings.

Based on the vendor specific indicator, a second operating frequency for the command interface is selected (208). For example, controller 110 may, based on the vendor specific indicator, select a second operating frequency for CA interface 131*a*. Thus, for example, if the vendor specific information 122 indicates that memory component 120 (and CA interface 131*b*, in particular) may be operated at a higher frequency than it is currently being operated, control circuitry 111 may (via frequency control circuitry 113) configure CACK interface 133*a* to select a second frequency (e.g., $f_2$) for the CACK clock signal to be cycled at.

FIG. 3 is a flowchart illustrating a method of re-training a memory system. One or more steps illustrated in FIG. 3 may be performed by, for example, memory system 100, and/or its components. A command interface is trained while the command interface is operated at a first frequency (302). For example, while CACK interface 133*a* is transmitting a clock signal having a first frequency, controller 110 may transmit test pattern values to memory component 120 via CA interface 1321*a*. Memory component 120 may transmit the values received at CA interface 131*b* back to controller 110. Controller 110 may then compare the test pattern values received by memory component 120 to the transmitted test pattern values. Based on these comparisons, controller 110 (and training control circuitry 112, in particular) may adjust one or more transmit timings used by CA interface 131*a*.

FIG. 3 is a flowchart illustrating a method of re-training a memory system. One or more steps illustrated in FIG. 3 may be performed by, for example, memory system 100, and/or its components. A command interface is trained while the command interface is operated at a first frequency (302). For example, while CACK interface 133*a* is transmitting a clock signal having a first frequency, controller 110 may transmit test pattern values to memory component 120 via CA interface 131*a*. Memory component 120 may transmit the values received at CA interface 131*b* back to controller 110. Controller 110 may then compare the test pattern values received by memory component 120 to the transmitted test pattern values. Based on these comparisons, controller 110 (and training control circuitry 112, in particular) may adjust one or more transmit timings used by CA interface 131*a*.

Based on the vendor specific indicator, a second operating frequency for the command interface is selected (306). For example, the vendor specific information 122 may indicate that memory component 120 (and CA interface 131*b*, in particular) can be operated at a higher frequency. In response, controller 110 may cause CACK interface 133*a* to output a clock signal at the higher frequency.

The command interface is trained while the command interface is operated at the second frequency (308). For example, while CACK interface 133*a* is transmitting a clock signal having the second frequency, controller 110 may transmit test pattern values to memory component 120 via CA interface 1321*a*. Memory component 120 may transmit the values received at CA interface 131*b* back to controller 110. Controller 110 may then compare the test pattern values received by memory component 120 to the transmitted test pattern values. Based on these comparisons, controller 110 (and training control circuitry 112, in particular) may adjust one or more transmit timings used by CA interface 131*a*.

Figure 4:
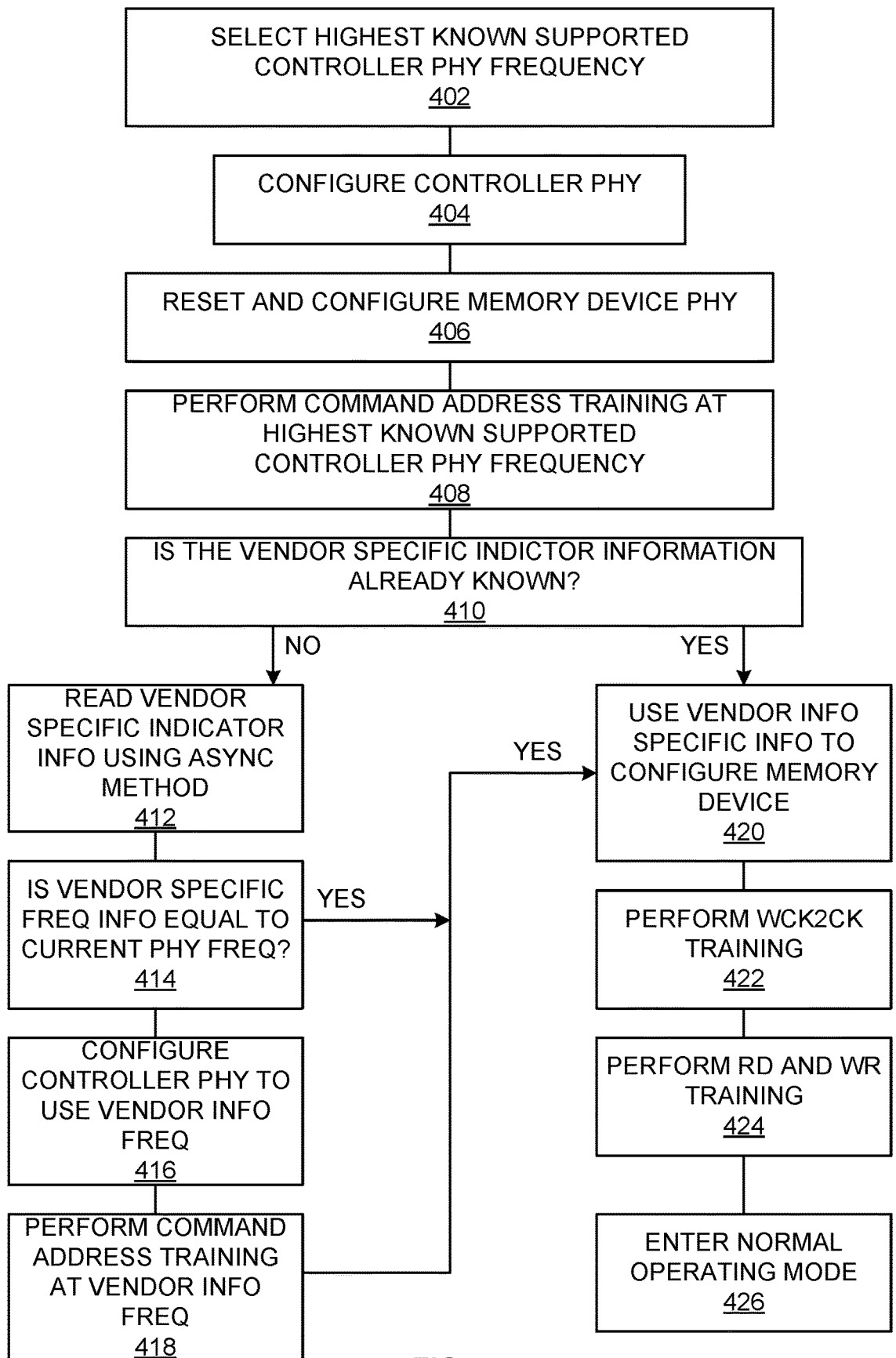
FIG. 4 is a flowchart illustrating a method of configuring a memory component interface.

FIG. 4 is a flowchart illustrating a method of configuring a memory component interface. One or more steps illustrated in FIG. 4 may be performed by, for example, memory system 100, and/or its components. The highest known supported controller PHY frequency is selected (402). For example, the highest known supported frequency for CA interface 131*a* that is supported by controller 110 and memory component 120 may be selected and used to operate CACK interface 133*a* and CA interface 131*a*. This highest known supported frequency is one which is supported by memory component 120 and controller 110 without knowing vendor identification details.

The controller PHY is configured (404). For example, registers in control circuitry 111 may be programmed to define the memory system 100 attributes that are not vendor specific. Examples of configurations include, but are not limited to: whether CA interface 131*a* and CACK interface 133*a* are to be on-die terminated; whether memory component 120 is to be operated in x8 (clamshell) mode or x16; whether memory component 120 is to be operated in pseudo mode or 2-channel mode.

The memory device PHY is reset and configured (406). For example, controller 110 may reset and configure memory component 120 with attributes that are not vendor specific. Examples of configurations include, but are not limited to: whether CA interface 131*b* and CACK interface 133*b* are to be on-die terminated; whether memory component 120 is to be operated in x8 (clamshell) mode or x16; whether memory component 120 is to be operated in pseudo mode or 2-channel mode.

Command address training is performed at the highest known supported controller PHY frequency (408). For example, while CACK interface 133*a* is transmitting a clock signal at the highest known frequency supported by controller 110 and memory component 120, controller 110 may transmit test pattern values to memory component 120 via CA interface 131*a*. Memory component 120 may transmit the values received at CA interface 131*b* back to controller 110. Controller 110 may then compare the test pattern values received by memory component 120 to the transmitted test pattern values. Based on these comparisons, controller 110 (and training control circuitry 112, in particular) may adjust one or more transmit timings used by CA interface 131*a*.

If the vendor specific indicator information is already known, flow proceeds to box 420. If the vendor specific indicator information is not already known, flow proceeds to box 412 (410). In box 412, the vendor specific indicator information is read using an asynchronous or low speed method (412). For example, controller 110 may read vendor specific information 122 from memory component 120 using an MRS command that statically places the vendor specific indicator information on DQ interface 132*b*.

If the vendor specific indicator information indicates that CA interface 131*b* may be operated at a higher frequency than the highest known supported controller PHY frequency, flow proceeds to box 416. If the vendor specific indicator information indicates that the highest frequency CA interface 131*b* may be operated at is highest known supported controller PHY frequency, flow proceeds to box 420 (414). In box 416, the controller PHY is configured to use the frequency specified by the vendor specific indicator information (416). For example, controller 110 may cause CACK interface 133*a* to output a clock signal at the frequency specified by the vendor specific indicator information.

Command address training is performed at the vendor specific indicator information frequency (418). For example, while CACK interface 133*a* is transmitting a clock signal having a frequency specified by the vendor specific indicator information, controller 110 may transmit test pattern values to memory component 120 via CA interface 131*a*. Memory component 120 may transmit the values received at CA interface 131*b* back to controller 110. Controller 110 may then compare the test pattern values received by memory component 120 to the transmitted test pattern values. Based on these comparisons, controller 110 (and training control circuitry 112, in particular) may adjust one or more transmit timings used by CA interface 131*a*.

Vendor specific indicator information is used to configure the memory device (420). For example, controller 110 may transmit MRS commands to memory component 120 that set one or more of: (1) latency; (2) vendor specific features; (3) DQ termination; (4) WCK termination; (5) DQ drive strength; (6) WCK drive strength, etc. WCK2CK training is performed (422). For example, controller 110 may adjust a phase relationship between the timing reference signal transmitted from CACK interface 133*a* and the timing reference signal transmitted from data clock interface 134*a*.

Read and write training are performed (424). For example, controller 110 may adjust a phase relationship between the timing reference signal transmitted from data clock interface 134a and values transferred via DQ interface 132a and DQ interface 132b. Normal operating mode is entered (426).

The methods, systems and devices described above may be implemented in computer systems, or stored by computer systems. The methods described above may also be stored on a non-transitory computer readable medium. Devices, circuits, and systems described herein may be implemented using computer-aided design tools available in the art, and embodied by computer-readable files containing software descriptions of such circuits. This includes, but is not limited to one or more elements of memory system 100, and its components. These software descriptions may be: behavioral, register transfer, logic component, transistor, and layout geometry-level descriptions. Moreover, the software descriptions may be stored on storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, and so on.

FIG. 5 is a block diagram illustrating one embodiment of a processing system 500 for including, processing, or generating, a representation of a circuit component 520. Processing system 500 includes one or more processors 502, a memory 504, and one or more communications devices 506. Processors 502, memory 504, and communications devices 506 communicate using any suitable type, number, and/or configuration of wired and/or wireless connections 508.

Processors 502 execute instructions of one or more processes 512 stored in a memory 504 to process and/or generate circuit component 520 responsive to user inputs 514 and parameters 516. Processes 512 may be any suitable electronic design automation (EDA) tool or portion thereof used to design, simulate, analyze, and/or verify electronic circuitry and/or generate photomasks for electronic circuitry. Representation 520 includes data that describes all or portions of memory system 100, and its components, as shown in the Figures.

Representation 520 may include one or more of behavioral, register transfer, logic component, transistor, and layout geometry-level descriptions. Moreover, representation 520 may be stored on storage media or communicated by carrier waves.

Data formats in which representation 520 may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email User inputs 514 may comprise input parameters from a keyboard, mouse, voice recognition interface, microphone and speakers, graphical display, touch screen, or other type of user interface device. This user interface may be distributed among multiple interface devices. Parameters 516 may include specifications and/or characteristics that are input to help define representation 520. For example, parameters 516 may include information that defines device types (e.g., NFET, PFET, etc.), topology (e.g., block diagrams, circuit descriptions, schematics, etc.), and/or device descriptions (e.g., device properties, device dimensions, power supply voltages, simulation temperatures, simulation models, etc.).

Memory 504 includes any suitable type, number, and/or configuration of non-transitory computer-readable storage media that stores processes 512, user inputs 514, parameters 516, and circuit component 520.

Communications devices 506 include any suitable type, number, and/or configuration of wired and/or wireless devices that transmit information from processing system 500 to another processing or storage system (not shown) and/or receive information from another processing or storage system (not shown). For example, communications devices 506 may transmit circuit component 520 to another system. Communications devices 506 may receive processes 512, user inputs 514, parameters 516, and/or circuit component 520 and cause processes 512, user inputs 514, parameters 516, and/or circuit component 520 to be stored in memory 504.

Implementations discussed herein include, but are not limited to, the following examples:

Example 1: A method, comprising: providing, at a first frequency, a command interface clock to be used by a command interface of a memory component to determine a first operating frequency of the command interface; training the command interface while the command interface is operated at the first frequency; after training the command interface while the command interface is operated at the first frequency, reading a vendor specific indicator while the command interface is operated at the first frequency; and, based on the vendor specific indicator, selecting a second operating frequency of the command interface.

Example 2: The method of claim 1, wherein the memory component is compatible with a graphics double data rate standard (GDDR).

Example 3: The method of claim 1, wherein the memory component is compatible with a Graphics Double Data Rate 6 (GDDR6) Synchronous Graphics Random Access Memory (SGRAM) specification.

Example 4: The method of claim 1, wherein the second operating frequency is greater than the first operating frequency.

Example 5: The method of claim 4, further comprising: training the command interface while the command interface is operated at the second operating frequency.

Example 6: The method of claim 1, wherein the second operating frequency is equal to the first operating frequency.

Example 7: The method of claim 1, further comprising: transmitting, to the command interface, a mode register set command to place the memory component in a command interface training mode.

Example 8: A memory controller, comprising: a clock interface to transmit, to a memory component and at a first frequency, a command interface clock; a command interface where the command interface clock determines a first operating frequency of the command interface; and, circuitry configured to train the command interface while the command interface is operated at the first frequency and to, after training the command interface while the command interface is operated at the first frequency, read, while the command interface is operated at the first frequency, a vendor specific indicator from the memory component via the command interface, and to, based on the vendor specific indicator, select a second operating frequency of the command interface.

Example 9: The memory controller of claim 8, wherein the memory component is compatible with a graphics double data rate standard (GDDR).

Example 10: The memory controller of claim 8, wherein the memory component is compatible with a Graphics Double Data Rate 6 (GDDR6) Synchronous Graphics Random Access Memory (SGRAM) specification.

Example 11: The memory controller of claim 8, wherein the second operating frequency is greater than the first operating frequency.

Example 12: The memory controller of claim 8, wherein the circuitry is further configured to train the command interface while the command interface is operated at the second operating frequency.

Example 13: The memory controller of claim 8, wherein the second operating frequency is equal to the first operating frequency.

Example 14: The memory controller of claim 8, wherein the circuitry is further configured to transmit, to the command interface, a mode register set command to place the memory component in a command interface training mode.

Example 15: A system, comprising: a memory component to receive commands; and, a memory controller coupled to the memory component via a command interface, the memory controller configured to transmit, to the memory component and at a first frequency, a command interface clock that determines an operating frequency of the command interface, the memory controller further configured to train the command interface while the command interface is operated at the first frequency, the memory controller further configured to, after training the command interface while the command interface is operated at the first frequency, read, while the command interface is operated at the first frequency, a vendor specific indicator from the memory component via the command interface, and the memory controller further configured to, based on the vendor specific indicator, select a second operating frequency of the command interface.

Example 16: The system of claim 15, wherein the second operating frequency is greater than the first operating frequency.

Example 17: The system of claim 15, wherein the memory controller is further configured to train the command interface while the command interface is operated at the second operating frequency.

Example 18: The system of claim 15, wherein the second operating frequency is equal to the first operating frequency.

Example 19: The system of claim 15, wherein the memory controller is further configured to transmit, to the memory component, a mode register set command to place the memory component in a command interface training mode.

Example 20: The system of claim 15, wherein the memory controller is further configured to transmit, to the memory component, a plurality of configuration indicators while the command interface clock is inactive.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A method, comprising:
   providing, at a first frequency, a command interface clock to be used by a command interface of a memory component to determine a first operating frequency of the command interface, wherein the memory component is compatible with at least one of a graphics double data rate standard (GDDR) or a Graphics Double Data Rate 6 (GDDR6) Synchronous Graphics Random Access Memory (SGRAM) specification;
   training, based on values received by the command interface during the training, the command interface while the command interface is operated at the first frequency;
   after training the command interface while the command interface is operated at the first frequency, reading a vendor specific indicator from the memory component that was transmitted by the memory component in response to a command sent via the command interface while the command interface is operated at the first frequency;
   based on the vendor specific indicator, selecting a second operating frequency of the command interface, wherein the second operating frequency is greater than the first operating frequency; and
   transmitting, to the command interface, a mode register set command to place the memory component in a command interface training mode, wherein the command interface training mode causes the command interface to bridge the values received by the command interface to a direct-quadrature (DQ) interface, to compare patterns received by the memory component to a set of expected values, and to adjust one or more transmit timing values of the command interface based on results derived from the comparison of the patterns received by the memory component to the set of expected values.

2. The method of claim 1, further comprising:
   training the command interface while the command interface is operated at the second operating frequency.

3. The method of claim 1, wherein the second operating frequency is equal to the first operating frequency.

4. A memory controller, comprising:
   a clock interface to transmit, to a memory component and at a first frequency, a command interface clock;
   a command interface of the memory component where the command interface clock determines a first operating frequency of the command interface; and,
   circuitry configured to train, based on values received by the command interface during training, the command interface while the command interface is operated at the first frequency and to, after training the command interface while the command interface is operated at the first frequency, read, while the command interface is operated at the first frequency, a vendor specific indicator from the memory component that was transmitted by the memory component in response to a command sent via the command interface to, based on the vendor specific indicator, select a second operating frequency of the command interface, wherein the memory component is compatible with at least one of a graphics double data rate standard (GDDR) or a Graphics Double Data Rate 6 (GDDR6) Synchronous Graphics Random Access Memory (SGRAM) specification, and to transmit, to the command interface, a mode register set command to place the memory component in a command interface training mode, wherein the command interface training mode causes the command interface to bridge the values received by the command interface to a direct-quadrature (DQ) interface, to compare patterns received by the memory component to a set of expected values, and to adjust one or more transmit timing values of the command interface based on results derived from the comparison of the patterns received by the memory component to the set of expected values.

5. The memory controller of claim 4, wherein the circuitry is further configured to train the command interface while the command interface is operated at the second operating frequency.

6. The memory controller of claim 4, wherein the second operating frequency is equal to the first operating frequency.

7. A system, comprising:
   a memory component to receive commands, wherein the memory component is compatible with at least one of a graphics double data rate standard (GDDR) or a Graphics Double Data Rate 6 (GDDR6) Synchronous Graphics Random Access Memory (SGRAM) specification; and,
   a memory controller coupled to the memory component via a command interface of the memory component, the memory controller configured to transmit, to the memory component and at a first frequency, a command interface clock that determines an operating frequency of the command interface, the memory controller further configured to train the command interface, based on first values received by the command interface, while the command interface is operated at the first frequency, the memory controller further configured to, after training the command interface while the command interface is operated at the first frequency, read, while the command interface is operated at the first frequency, a vendor specific indicator from the memory component that was transmitted by the memory component in response to a command sent via the command interface, and, the memory controller further configured to, based on the vendor specific indicator, select a second operating frequency of the command interface of the memory component, wherein the second operating frequency is greater than the first operating frequency, and the memory controller further configured to transmit, to the command interface, a mode register set command to place the memory component in a command interface training mode, wherein the command interface training mode causes the command interface to bridge the values received by the command interface to a direct-quadrature (DQ) interface, to compare patterns received by the memory component to a set of expected values, and to adjust one or more transmit timing values of the command interface based on results derived from the comparison of the patterns received by the memory component to the set of expected values.

8. The system of claim 7, wherein the memory controller is further configured to train the command interface, based on second values received by the command interface, while the command interface is operated at the second operating frequency.

9. The system of claim 7, wherein the memory controller is further configured to transmit, to the memory component, a plurality of configuration indicators while the command interface clock is inactive.

* * * * *